United States Patent
Li et al.

(10) Patent No.: US 9,059,038 B2
(45) Date of Patent: Jun. 16, 2015

(54) SYSTEM FOR IN-SITU FILM STACK MEASUREMENT DURING ETCHING AND ETCH CONTROL METHOD

(71) Applicant: TOKYO ELECTRON LIMITED, Tokyo (JP)

(72) Inventors: Shifang Li, Pleasanton, CA (US); Junwei Bao, Los Altos, CA (US); Hanyou Chu, Palo Alto, CA (US); Wen Jin, Fremont, CA (US); Ching-Ling Meng, Sunnyvale, CA (US); Weiwen Xu, Fremont, CA (US); Ping Wang, San Jose, CA (US); Holger Tuitje, Fremont, CA (US); Mihail Mihaylov, San Jose, CA (US); Xinkang Tian, San Jose, CA (US)

(73) Assignee: Tokyo Electron Limited, Tokyo (JP)

( * ) Notice: Subject to any disclaimer, the term of this patent is extended or adjusted under 35 U.S.C. 154(b) by 20 days.

(21) Appl. No.: 13/945,759

(22) Filed: Jul. 18, 2013

(65) Prior Publication Data

US 2014/0024143 A1  Jan. 23, 2014

Related U.S. Application Data

(60) Provisional application No. 61/672,880, filed on Jul. 18, 2012.

(51) Int. Cl.
*H01L 21/66* (2006.01)
*H01J 37/32* (2006.01)

(52) U.S. Cl.
CPC ............... *H01L 22/12* (2013.01); *H01L 22/26* (2013.01); *H01J 37/32972* (2013.01)

(58) Field of Classification Search
None
See application file for complete search history.

(56) References Cited

U.S. PATENT DOCUMENTS

| | | | |
|---|---|---|---|
| 3,059,611 A | 10/1962 | Fury | |
| 3,612,692 A | 10/1971 | Kruppa | |
| 4,147,435 A | 4/1979 | Habegger | |
| 5,139,904 A * | 8/1992 | Auda et al. | 430/30 |
| 5,223,914 A * | 6/1993 | Auda et al. | 356/630 |
| 5,733,820 A * | 3/1998 | Adachi et al. | 438/719 |
| 6,107,000 A * | 8/2000 | Lee et al. | 430/296 |
| 6,225,639 B1 * | 5/2001 | Adams et al. | 250/559.4 |
| 6,303,416 B1 * | 10/2001 | Bruce et al. | 438/166 |
| 6,340,603 B1 * | 1/2002 | Bell | 438/9 |
| 6,350,390 B1 * | 2/2002 | Liu et al. | 216/59 |
| 6,620,631 B1 * | 9/2003 | Tao et al. | 438/9 |
| 8,415,884 B2 | 4/2013 | Chen | |
| 2004/0248423 A1 * | 12/2004 | Sato et al. | 438/740 |
| 2005/0221513 A1 * | 10/2005 | Yue et al. | 438/14 |
| 2006/0007453 A1 * | 1/2006 | Horak et al. | 356/625 |
| 2006/0009872 A1 * | 1/2006 | Prager et al. | 700/121 |
| 2007/0284335 A1 * | 12/2007 | Tsujimoto | 216/41 |
| 2008/0185538 A1 * | 8/2008 | Ohnishi et al. | 250/492.22 |
| 2009/0212211 A1 * | 8/2009 | Iwasaki et al. | 250/307 |
| 2009/0258304 A1 * | 10/2009 | Yamada et al. | 430/30 |
| 2009/0291399 A1 * | 11/2009 | Yamamoto | 430/324 |
| 2012/0291952 A1 * | 11/2012 | Davis et al. | 156/345.25 |
| 2014/0273297 A1 * | 9/2014 | Banna et al. | 438/8 |

* cited by examiner

*Primary Examiner* — Allan Olsen

(57) ABSTRACT

Disclosed is an in-situ optical monitor (ISOM) system and associated method for controlling plasma etching processes during the forming of stepped structures in semiconductor manufacturing. The in-situ optical monitor (ISOM) can be optionally configured for coupling to a surface-wave plasma source (SWP), for example a radial line slotted antenna (RLSA) plasma source. A method is described to correlate the lateral recess of the steps and the etched thickness of a photoresist layer for use with the in-situ optical monitor (ISOM) during control of plasma etching processes in the forming of stepped structures.

10 Claims, 5 Drawing Sheets

SYSTEM FOR IN-SITU FILM STACK MEASUREMENT DURING ETCHING AND ETCH CONTROL METHOD

CROSS REFERENCE TO RELATED APPLICATIONS

This application is based on and claims the benefit of and priority to co-pending U.S. Provisional Patent Application No. 61/672,880, entitled "SYSTEM FOR IN-SITU FILM STACK MEASUREMENT DURING ETCHING AND ETCH CONTROL METHOD" (Ref. No. TTI-239PROV), filed on Jul. 18, 2012, the entire contents of which are herein incorporated by reference.

BACKGROUND OF THE INVENTION

1. Field of the Invention

The present invention relates to a method and system for controlling the process of etching a structure on a substrate, for example, in semiconductor manufacturing. More particularly, it relates to a system and method for control of an etch process for forming of a structure with a feature, or multiple features in the horizontal direction, for example a stepped structure, on the substrate.

2. Description of Related Art

Plasma etch processes are commonly used in conjunction with photolithography in the process of manufacturing semiconductor devices, liquid crystal displays (LCDs), light-emitting diodes (LEDs), and some photovoltaics (PVs). Generally, a layer of radiation-sensitive material, such as photoresist, is first coated on a substrate and exposed to patterned light to impart a latent image thereto. Thereafter, the exposed radiation-sensitive material is developed to remove exposed radiation-sensitive material (or unexposed, if negative tone photoresist is used), leaving a pattern of radiation-sensitive material which exposes areas to be subsequently etched, and covers areas where no etching is desired. During the etch process, for example a plasma etch process, the substrate and radiation-sensitive material pattern are exposed to energetic ions in a plasma processing chamber, so as to effect removal of the material underlying the radiation-sensitive material in order to form etched features, such as vias, trenches, etc. Following etching of the features in the underlying material, the remainder of the radiation-sensitive material is removed from the substrate using an ashing or stripping process, to expose formed etched structures ready for further processing.

In many types of devices, such as semiconductor devices, the plasma etch process is performed in a first material layer overlying a second material layer, and it is important that the etch process be stopped accurately once the etch process has formed an opening or pattern in the first material layer, without continuing to etch the underlying second material layer. In other devices, the vertical dimensions of device features, such as sidewalls, depths of vias and trenches, etc., are critical parameters regardless of whether there is an underlying layer present. In both cases, the duration of the etch process needs to be controlled accurately so as to either achieve a precise etch stop at the top of an underlying material layer, or to achieve an exact vertical dimension of etched features.

For purposes of controlling the etch process various types of endpoint control are utilized, some of which rely on analyzing the chemistry of the gas in the plasma processing chamber in order to deduce whether the etch process has progressed, for example, to an underlying material layer of a different chemical composition than the material of the layer being etched. Alternatively, in-situ metrology devices can be used to directly measure the etched features during the etch process and provide feedback control for accurately stopping the etch process once an underlying material layer has been reached, or a certain vertical feature dimension has been attained.

In modern semiconductor devices, particularly FLASH RAM devices, novel structures are increasingly frequently being used that involve stacked stepped layers, stepped pyramidal structures, or staircase structures, (hereinafter "stepped structures".) Stepped structures can involve steps made of the same or different material layers. The production of these stepped structures demands that lateral etch control be maintained as well as the aforementioned vertical etch control, in order for a stepped structure to be produced. The lateral etch control ensures that a desired lateral recess of one step with respect to the previous step in the stepped structure, is maintained, and the vertical etch control ensures that the height of each step is within specified tolerances.

Systems and methods for control of etch processes of stepped structures have heretofore been deficient. For example, in many prior art etch process flows, measurements of the stepped structure are only taken when the substrate is removed from the etch chamber and taken to a dedicated metrology station for measurement. Information gained from stepped structure measurement is then fed back to the etch process, to adjust for any dimensional deviations in subsequently-processed devices. This results in a large percentage of devices being produced out-of-spec, requiring rework or being discarded, i.e. the device yield is low.

Therefore, there exists a need for advanced control of the etch process of stepped structures. Such an advanced control system and its associated method should preferably have a low cost of implementation, i.e. any hardware modification made to an etch tool to enable the use of such an advanced control method should be of relatively low cost because the hardware modification will need to deployed to a large number of etch tools, as typically exist in any modern semiconductor device fab. The advanced control system will further need to achieve a target accuracy in the etching of stepped structures for the relatively low hardware modification and control method implementation costs. Lastly, the advanced control system should enable a significant increase of device yield.

SUMMARY OF THE INVENTION

The present invention relates to a method and system for controlling the process of etching a structure on a substrate, for example, in semiconductor manufacturing. More particularly, it relates to a system and method for control of an etch process for forming of a stepped structure on the substrate.

An embodiment of the present invention includes a method for monitoring and controlling plasma etching, the method comprising: loading a substrate into a plasma processing chamber, the substrate comprising a structure which comprises a first layer formed thereupon and a radiation-sensitive material layer formed on top of the first layer; initiating a first plasma etch process in the plasma processing chamber, the first plasma etch process recipe being selected to selectively reduce the thickness of the radiation-sensitive material layer and laterally trim the radiation-sensitive material layer; illuminating the structure on the substrate with an incident light beam, the reflection of the incident light beam from the structure forming a reflected light beam; measuring a first intensity of the reflected light beam; determining the etched thickness of the radiation-sensitive material layer from the measured first intensity of the reflected light beam during the first plasma etch process; determining the amount of lateral recess of the first layer from a previously-established correlation of the amount of lateral recess of the first layer to the etched thickness of the radiation-sensitive material layer; comparing the amount of lateral recess of the first layer to a desired lateral recess of the first layer, and stopping the first plasma etch process if the amount of lateral recess of the first layer is equal to or greater than the desired lateral recess of the first layer, or otherwise continuing the first plasma etch and determining the amount of lateral recess of the first layer, thereby forming a trimmed radiation-sensitive material pattern; initiating a second plasma etch process, the second plasma etch process recipe being selected to selectively etch the first layer so as to transfer the trimmed radiation-sensitive material pattern into the first layer, illuminating the structure on the substrate with the incident light beam, the reflection of the incident light beam from the structure forming the reflected light beam; measuring a second intensity of the reflected light beam; determining the etched thickness of the first layer in a region not covered by the radiation-sensitive material layer, from the measured second intensity of the reflected light beam; and comparing the etched thickness of the first layer to a desired etched thickness of the first layer, and stopping the second plasma etch process if the etched thickness of the first layer is greater than or equal to the desired etched thickness of the first layer, or otherwise continuing the second plasma etch process and determining the etched thickness of the first layer, thereby forming a step in the first layer.

In a further embodiment, the method steps can be repeated until a stepped structure is formed in the first layer on the substrate, wherein successive steps in the first layer have a progressively smaller lateral dimension as a distance of a step from the substrate increases. Furthermore, the step of establishing the correlation of the amount of lateral recess of the first layer to the etched thickness of the radiation-sensitive material layer may comprise measuring the amount of lateral recess of the first layer with a scanning electron microscope (SEM), for example, using test substrates.

In yet a further embodiment, the invention includes an in-situ optical monitor (ISOM) configured for measuring reflection from a substrate during a plasma etching process in a plasma processing chamber, the optical monitor comprising: a reflectometer, comprising: a light source for providing an incident light beam for substrate illumination, the incident light beam being reflected from the substrate to form a reflected light beam; a photodetector for measuring an intensity of the reflected light beam, an optical window mounted on a wall of the plasma processing chamber opposite the substrate, the optical window being configured to transmit the incident light beam and the reflected light beam, the optical window comprising an upper window, a lower window, and a window mesh; and a controller configured to receive the measured intensity of the reflected light beam and control the plasma etching process based on the measured intensity of the reflected light beam. In other embodiments, the upper and lower window, and the window mesh can be the slow-wave plate, resonator plate, and slotted antenna, respectively, of a surface wave plasma source (SWP), for example a radial line slotted antenna (RLSA) plasma source.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF EXEMPLARY EMBODIMENTS

In the following description, in order to facilitate a thorough understanding of the invention and for purposes of explanation and not limitation, specific details are set forth, such as particular geometries of a lithography, coater/developer, and gap-fill treatment system, and descriptions of various components and processes. However, it should be understood that the invention may be practiced in other embodiments that depart from these specific details.

In the description to follow, the terms radiation-sensitive material and photoresist may be used interchangeably, photoresist being only one of many suitable radiation-sensitive materials for use in photolithography. Similarly, hereinafter the term substrate, which represents the workpiece being processed, may be used interchangeably with terms such as semiconductor wafer, LCD panel, light-emitting diode (LED), photovoltaic (PV) device panel, etc., the processing of all of which falls within the scope of the claimed invention.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Figure 1:
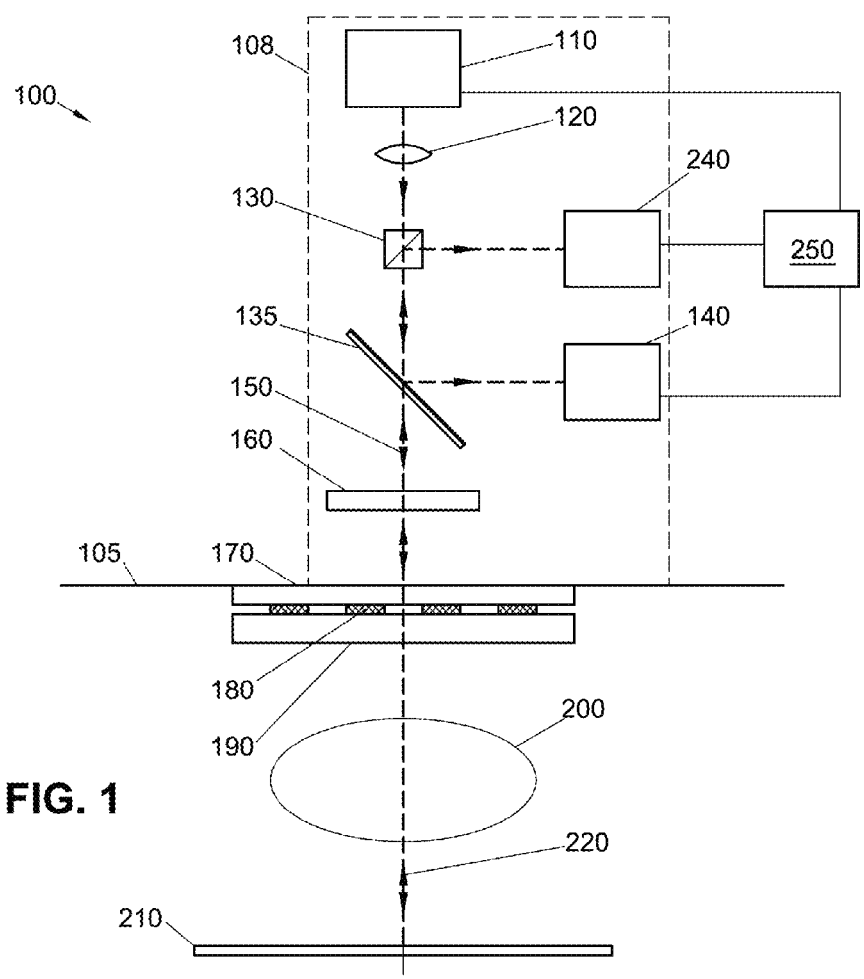
FIG. 1 is a schematic view of a reflectometer part of the in-situ optical monitor (ISOM) in accordance with an embodiment of the invention.

To effect the needed control of a process of forming a stepped structure, an in-situ optical monitor (ISOM) utilizes a reflectometer to acquire the necessary signals used for etch process control. FIG. 1 shows an embodiment of in-situ optical monitor (ISOM) 100, whose main component is a reflectometer 108. The reflectometer is mounted on a wall of the plasma processing chamber 105, inside which plasma etch processes for forming a stepped structure are performed. The reflectometer is mounted on a wall of plasma processing chamber 105 opposite the substrate 210, which is disposed on a chuck or pedestal (not shown) during etch processing. The reflectometer 108 forms an incident light beam 150, which undergoes a reflection from substrate 210 and any structures formed thereupon. The intensity of reflected light beam 220 is then measured and compared in the intensity of the incident light beam, the ratio of intensities providing the necessary information from which dimensional and other parameters of a structure formed on substrate 210 can be deduced, as will be explained later.

In reflectometer 108, a light source 110 is used to form the incident light beam 150. In an embodiment, light source 110 is a monochromatic or nearly-monochromatic light source, such as a laser, light emitting diode (LED), or a broadband light source such as a broadband lamp coupled with an optical filter to produce an essentially monochromatic incident light beam 150. In this latter case, various kinds of broadband lamps can be used, such as Xenon lamps, etc. Light source 110 may or may not be mounted proximate the plasma processing chamber 105 or any enclosures housing reflectometer 108, and in the case of being mounted remotely, the incident light beam 150 can be fed into other components proximate the plasma processing chamber 105 by an optical fiber (not shown), or by a set of optical components such a mirrors, prisms, etc. From light source 110, incident light beam 150 is passed to a collimator 120 which forms the incident light beam of an appropriate diameter and focus to achieve a certain illuminated spot size on substrate 210. The size of the illuminated spot on substrate 210 can vary from 10 µm to 100 µm, and preferably from 20 µm to 50 µm, depending on the sizes and characteristics of the structures being measured on substrate 210. In an embodiment, the collimated incident light beam 150 is then passed through a polarizer 130, which imposes a linear polarization to the incident light beam 150 that reaches substrate 210. Polarization of incident light beam 150 increases the signal to noise ratio of the reflectometer signal, and thereby improves measurement accuracy. In embodiments used for certain less-demanding applications, however, the polarizer 130 may not be necessary, and can be omitted. From polarizer 130, the incident light beam 150 proceeds further to a partially-reflective mirror 135 which serves the purpose to direct a percentage of incident light beam 150 into a reference detector 140. Reference detector 140 can be a photodiode, a linear or 2D array CCD, a photomultiplier, etc. and its purpose is to monitor the intensity of incident light beam 150 so any changes of the intensity of incident light beam 150 can be accounted for in the measurement process. Such changes of intensity may occur due to drifting output power of light source 110, for example. Further downstream, in an embodiment, an optional quarter-wave plate 160 may also be used.

After passing through the optional quarter-wave plate 160, incident light beam 150 reaches a window assembly mounted on the wall of plasma processing chamber 105, the window assembly comprising an upper window 170, a lower window 190, and a window mesh 180 disposed therebetween. The window assembly allows access for incident light beam 150 to the inside of plasma processing chamber 105, and also allows the passage of reflected light beam 220 out of the plasma processing chamber 105, so its intensity can be measured. Depending on the configuration of plasma processing chamber 105, i.e. the type of plasma source being used, the configuration of the window assembly can vary.

The configuration of window assembly as shown in FIG. 1 is particularly well suited to an embodiment where a surface wave plasma source (SWP) is used to form a plasma 200 in plasma processing chamber 105. One embodiment of a surface wave plasma source (SWP) is a radial line slotted antenna (RLSA) plasma source, described in more detail in U.S. Pat. No. 8,415,884, entitled "Stable surface wave plasma source", and incorporated herein by reference in its entirety. In a radial line slotted antenna (RLSA) plasma source, the plasma 200 is generated by energizing the gas in plasma processing chamber 105 by way of microwave power coupled from an external microwave power source (not shown) to a microwave launcher component comprising a slow-wave plate, a slotted antenna, and a resonator plate. Microwave power is first coupled into the slow-wave plate, generally made of a dielectric material, such as quartz or a ceramic material, but in some embodiments it may be replaced by a volume of air or other gas, via a microwave waveguide. The slow-wave plate distributes microwave power across the top side of the plasma processing chamber 105, wherein the microwave power is coupled to the plasma 200 via a metallic slotted antenna which has perforations and slots through which microwaves can penetrate into the space below the slotted antenna. Once past the slotted antenna, microwaves are coupled via a dielectric resonator plate to the plasma 200. The resonator plate can be made of quartz or ceramic material, and besides coupling microwaves to the plasma 200, it also serves to enclose plasma processing chamber 105 in a vacuum tight manner. In an embodiment of plasma processing chamber 105 where the slow-wave plate and resonator plate are made of quartz or other suitable optically-transparent dielectric material, the upper window 170 can be advantageously made as part of the slow-wave plate, and the lower window 190 can be made as a part of the resonator plate. Therefore, besides coupling microwave power, the slow-wave plate and resonator plate can also serve the purpose of windows for optical access of in-situ optical monitor (ISOM) 100, and reflectometer 108, to the plasma 200 and the substrate 210 being processed. The slotted antenna of the radial line slotted antenna (RLSA) plasma source can be suitably perforated in one or more places to allow the passage of the incident light beam 150 and reflected light beam 220, to and from plasma processing chamber 105, thereby forming window mesh 180 shown in FIG. 1 disposed between upper window 170 and lower window 190. Perforations of window mesh 180 can be kept small, i.e. just large enough to pass the incident light beam 150 and the reflected light beam 220, but not allow a significant amount of light generated by the plasma 200 back into the reflectometer 108. Furthermore, keeping the perforations small prevents the perforations from affecting the uniformity of microwave coupling through the slotted antenna, i.e. window mesh 180.

Upon passing the upper window 170, window mesh 180, and lower window 190, incident light beam 150 traverses the plasma-containing space of plasma processing chamber 105 to reach the top surface of substrate 210, where structures are being etched using plasma 200, for example stepped structures. Upon incidence on substrate 210 and any structures thereupon, incident light beam 150 undergoes reflection during which the intensity and phase of the beam are modified depending on the types, properties, dimensions, and materials of structures formed atop substrate 210. The reflected light beam 220 formed through the reflection on substrate 210 now traverses the plasma-containing space of plasma processing chamber 105 back towards the reflectometer 108. In an embodiment shown in FIG. 1, the incidence angle of incident light beam 150 is zero (measured customarily from the normal to the surface of substrate 210), and the reflection angle of reflected light beam 220 is thus also zero.

Upon passage through lower window 190, a perforation of window mesh 180, and upper window 170, the reflected light beam 220 passes through optional quarter-wave plate 160 and partially-reflective mirror 135 to reach polarizer 130 from whose internal semi-reflective surface, the reflected light beam 220 is directed at signal detector 240, where the intensity of reflected light beam 220 is converted into an electrical signal proportional to the light intensity of reflected light beam 220. The electrical signal may be digital or analog, depending on the type of signal detector being used. Suitable detectors include photodiodes, linear or 2D array CCDs, photomultipliers, etc. In an embodiment, reference detector 140 and signal detector 240 can be parts of a same device, such as a linear or 2D array CCD device. In the case where optional quarter-wave plate 160 does not exist, an extra optical component other than polarizer 130 may be needed to redirect the reflected light beam 220 to the signal detector 240.

Control of reflectometer and data acquisition are accomplished via controller 250 in communication with at least the light source 110, reference detector 140, and signal detector 240. Controller 250 can also be in communication with any other component of reflectometer 108 and/or in-situ optical monitor 100, and is also in communication with the etch tool controller (not shown) to allow control of the etch process performed inside plasma processing chamber 105.

Figure 2:
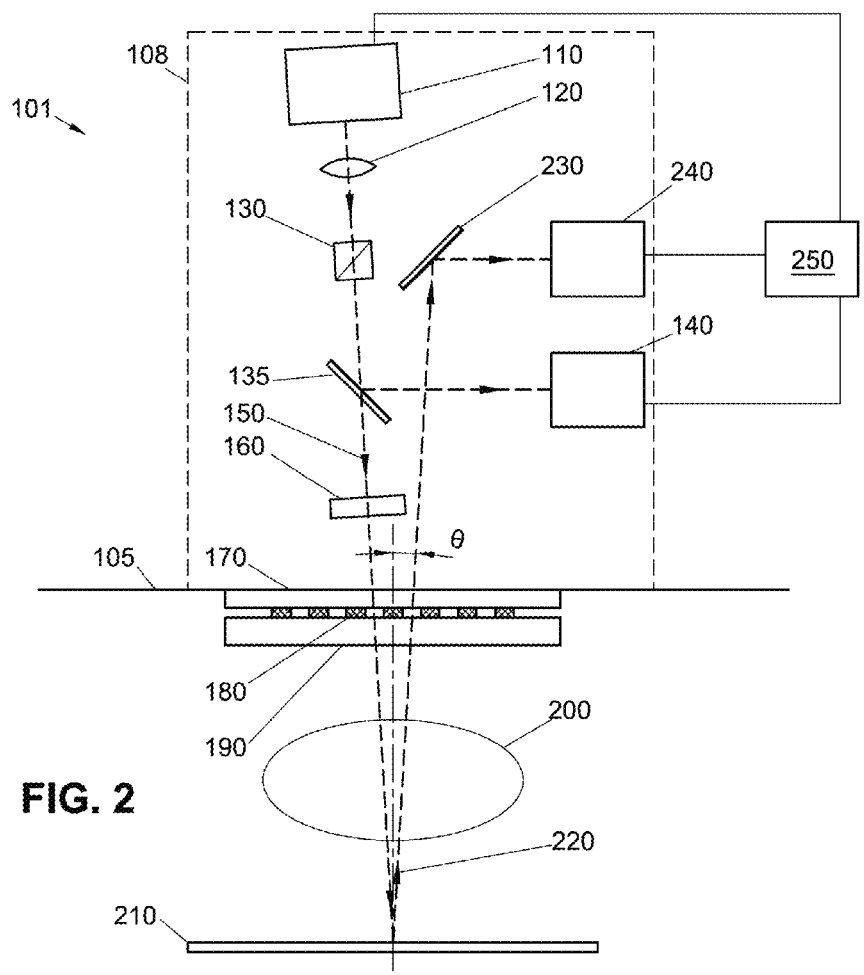
FIG. 2 is a schematic view of a reflectometer part of the in-situ optical monitor (ISOM) in accordance with another embodiment of the invention.

In operation of in-situ-optical monitor (ISOM) 100 of FIG. 1, inventors have noted that normal incidence of incident light beam 150 and normal reflection of reflected light beam can cause interference effects in monochromatic beams, particularly laser beams, leading to signal degradation. Interference effects arise from the incident light beam 150 and reflected light beam 220 tracing essentially the same pathway, perpendicular to substrate 210. To mitigate interference effects between the two beams, which can be particularly pronounced inside the window assembly where multiple quartz-to-air and quartz-to-vacuum interfaces are present, creating reflections which can interfere, an embodiment of in-situ optical monitor 101 has been developed as shown in FIG. 2, where like reference numerals denote the same elements previously described in FIG. 1. The embodiment of FIG. 2 also has the advantage of being less sensitive to changes of thickness of upper and lower windows 170 and 190 caused by thermal and vacuum force-induced stresses, which can cause birefringence effects, which in turn can affect the polarization of the incident light beam 150 and reflected light beam 220, as they pass through the windows, thereby affecting measurement accuracy.

In the reflectometer 108 of in-situ optical monitor (ISOM) 101 of FIG. 2, the incident light beam 150 and reflected light beam 220 are titled with respect to the normal to the surface of substrate 210, by an incidence angle θ, which can vary from greater than zero to less than 90 degrees, or alternatively from greater than zero to less than 10 degrees, and preferably from greater than zero to less than about 5 degrees. Being non-coincident now, incident light beam 150 and reflected light beam 220 do not interfere any more, leading to a cleaner measured signal at signal detector 240. To facilitate steering of the reflected light beam 220, an additional mirror 230 is used. All other components remain the same, with polarizer 130 and quarter-wave plate 160 remaining optional.

Besides less pronounced interference effects, further advantages of the embodiment of in-situ optical monitor (ISOM) 101 include the design inherently preventing return of even the slightest portion of the reflected light beam 220 into light source 110, which can cause light source instability and power drift.

Depending on the incidence angle θ, the incident light beam 150 and reflected light beam 220 can enter and exit the plasma processing chamber 105 via the same or different perforations of the slotted antenna, i.e. window mesh 180.

After a large number of substrate etch cycles in the etch tool, the plasma-facing surface of lower window 190 can become clouded due to chemical attack by the plasma chemistry resulting in a loss of light transmission due to scattering. The clouding may be caused either by accumulation of contaminant chemical species on the plasma-facing surface, or by chemical attack, i.e. etching of the plasma-facing surface, or both. To allow extended operation of the reflectometer 108 and in-situ optical monitor (ISOM) 101, provision can be made for transmission of the reflected light beam 220 via more than one perforation of the slotted antenna, i.e. window mesh 180. This is because the clouding of the plasma-facing surface of lower window 190 causes scattering of the reflected light beam 220, and allowing the scattered parts of reflected light beam 220 to be admitted via other perforations allows these scattered beams to be collected by an optical component, such as a lens (not shown), to be focused back onto the signal detector 240, thereby preventing or delaying signal loss.

In further embodiments of in-situ optical monitors 100 and 101 of FIGS. 1 and 2, other optical components may be used, such as mirrors, prisms, lenses, etc., to steer the incident light beam 150 and reflected light beam 220. The configuration and component layout of reflectometers 108 of FIGS. 1 and 2 do not necessarily need to be as shown exactly in FIGS. 1 and 2, but the light beams can be folded and steered by way of these additional components to facilitate packaging the in-situ optical monitors (ISOMs) 100 and 101 into a compact packaging suitable for mounting on the wall of plasma processing chamber 105.

Furthermore, in-situ optical monitors (ISOMs) 100 and 101 can be used with plasma sources other than surface wave plasma sources (SWP) or radial line slotted antenna (RLSA) plasma sources. For example, plasma processing chamber 105 may be configured to energize a plasma via a capacitive-coupled plasma source (CCP), inductively-coupled plasma source (ICP), or a transformer-coupled (TCP) plasma source. In such embodiments, the configuration of the window assembly may change, but will at least include one optically-transparent and vacuum-tight window, such as plasma-facing lower window 190. The window assembly may also comprise a window mesh 180, which in these embodiments may serve the additional purpose of providing RF shielding to plasma processing chamber 105.

Figure 3A:
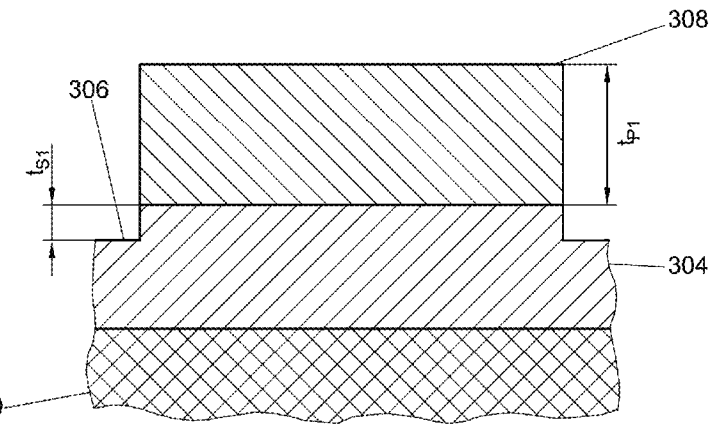
FIG. 3A-C are schematics of a series of etch steps to form one step of a stepped structure.
Figure 3B:
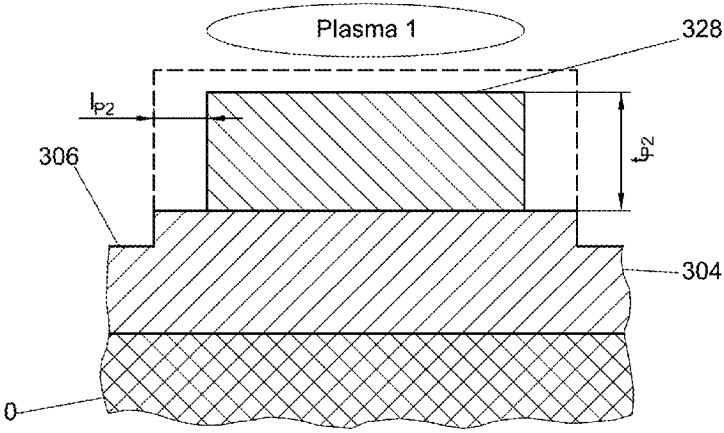
Figure 3C:
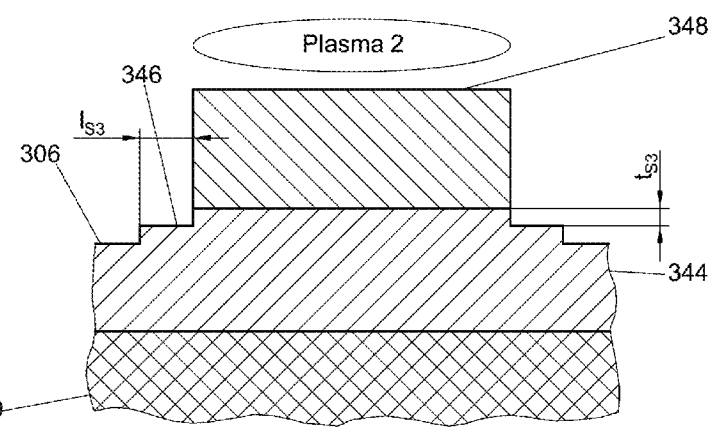

With reference now to FIGS. 3A-C, therein is shown a process of etching one step, i.e. etch cycle, of a stepped structure on substrate 210, to be performed in plasma processing chamber 105 of FIG. 1 or 2. In FIG. 3A, substrate 210 is shown with a first layer 304 deposited thereupon, the first layer 304 being used to form the stepped structure on substrate 210. First layer 304 may comprise an oxide, nitride, oxynitride, or any other suitable material which can be readily etched, from which a stepped structure needs to be made. In an embodiment, first layer 304 may comprise multiple sublayers (not shown). The multiple sublayers of first layer 304 may be arranged with alternating material compositions across the thickness of first layer 304. For example, alternating layers of oxide and nitride material may be used to form the sublayers of the first layer 304. The thicknesses of sublayers of first layer 304 may or may not correspond to the thicknesses of steps of the stepped structure to be formed. On top of first layer 304, a radiation-sensitive material layer 308 is deposited, such as photoresist. The radiation-sensitive material can be either positive or negative tone photoresist. The radiation-sensitive material layer 308 is used as a pattern, or mask, for etching the first layer 304 to form a stepped structure, as will be shown below. The process of selection of a suitable material for the first layer, and a suitable radiation-sensitive material are well known to persons skilled in the art of semiconductor processing.

With further reference to FIG. 3A, the thickness of the radiation-sensitive material layer 308 is $t_{P1}$, and the height of the existing first step is $t_{S1}$. The etch cycle of forming a step of the stepped structure now proceeds by initiating a first plasma etch process, as shown in FIG. 3B. The process recipe, i.e. gas chemistry and conditions of the first plasma etch process are selected so the first plasma selectively etches the radiation-sensitive material layer 308 mostly without affecting the first layer 304, i.e. the first plasma etch process is to have a high selectivity to the radiation-sensitive material. Furthermore, the recipe of the first plasma etch process is selected to be isotropic. This means that the etching of radiation-sensitive material layer 308 will proceed on all sides exposed to the first plasma, rather than just the top side. Following the first plasma etch process, the radiation-sensitive material layer 308 will be both reduced in thickness and laterally trimmed, to form radiation-sensitive material layer 328, as shown in FIG. 3B. The thickness of the radiation-sensitive material layer 328 is denoted $t_{P2}$, and the etched thickness of the radiation-sensitive material layer during the first plasma etch process is thus $t_{P1}$-$t_{P2}$. The amount of lateral trim of radiation-sensitive material layer is denoted $I_{P2}$. In general, the amount of lateral trim $I_{P2}$ and etched thickness $t_{P1}$-$t_{P2}$ are proportional to the duration of the first plasma etch process, and are thus mutually-related—a property that will be utilized in controlling the process of forming a stepped structure, as will be described later. The process of selection of a suitable chemistry and conditions for the first plasma etch process are well known to persons skilled in the art of semiconductor processing.

The process of forming a step now proceeds with initiation of a second plasma etch process in which the radiation-sensitive material layer 328 is used as a pattern, or mask, for etching a step 346 in the first layer 304, as shown in FIG. 3C. The process recipe, i.e. gas chemistry and conditions of the second plasma etch process are selected so the second plasma selectively etches the first layer 304, i.e. the second plasma etch process would preferably have a high selectivity to the material of first layer 304. However, it should be noted that high selectivity is not a necessary condition, as in the case of relatively lower selectivity, a large amount of radiation-sensitive material would be etched during the second plasma etch process, which can be corrected for by applying a suitably thicker radiation-sensitive material layer 308 at the start of the process. Furthermore, the recipe of the second plasma etch process is selected to be anisotropic. This means that the etching of first layer 304 will proceed predominantly in the vertical downwards direction with as little sideways etch as possible. Following the second plasma etch process, the first layer will be vertically etched to form the step 346 of height $t_{S3}$, where the height $t_{S3}$ is generally proportional to the duration of the second plasma etch process. The width of the formed step 346, i.e. lateral recess $I_{S3}$, is generally comparable to the amount of lateral trim $I_{P2}$ of radiation-sensitive material layer 328, but they are not necessarily equal because some etching of radiation-sensitive material also occurs during the second etch process. The process of selection of a suitable chemistry and conditions for the second plasma etch process are well known to persons skilled in the art of semiconductor processing.

In the example shown in FIG. 3A, the first layer 304 is shown with one step 306 already formed in it by a previous etch cycle. However, it is understood that the process described in FIGS. 3A-C may also be used to perform a first etch cycle, i.e. the etch cycle of formation of the first step 306, as well. In the process of formation of first step 306, the first plasma etch process may be omitted if the initial radiation-sensitive material layer pattern, formed by photolithography, is accurate enough for immediate etch transfer into the underlying first layer 304.

With the completion of step 346, as shown in FIG. 3O, the remaining radiation-sensitive material layer 348 and remaining first layer 344, with steps 306 and 346 formed therein, are now ready for the next etch cycle, in which a third step is formed in the remaining first layer 344. In practice, for FLASH RAM applications, stepped structures of eight steps are commonly used, but the number of steps may vary. Those skilled in the art will immediately recognize that the described method may also be used to form a structure involving a single step only, and the control methods to be described in the discussion to follow may be used in the process of creating such single step structures as well.

If one of in-situ optical monitors (ISOMs) 100 or 101, of FIG. 1 or 2, are used to monitor the formation of a stepped structure comprising eight steps, as described above, an exemplary signal 400, as shown in FIG. 4A, may be measured. To arrive at the signal depicted in FIG. 4A, the raw signal measured by the signal detector 240, which is proportional to the intensity of reflected light beam 220, is corrected for variation of intensity of the incident light beam 150 (e.g. due to variations of light source 110 output) as measured by the reference detector 140.

Figure 4A:
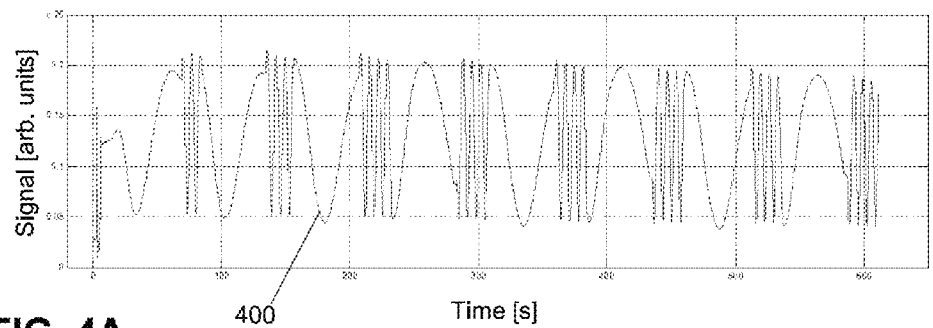
FIG. 4A-B represent an exemplary acquired signal measured by the in-situ optical monitor (ISOM).
Figure 4B:
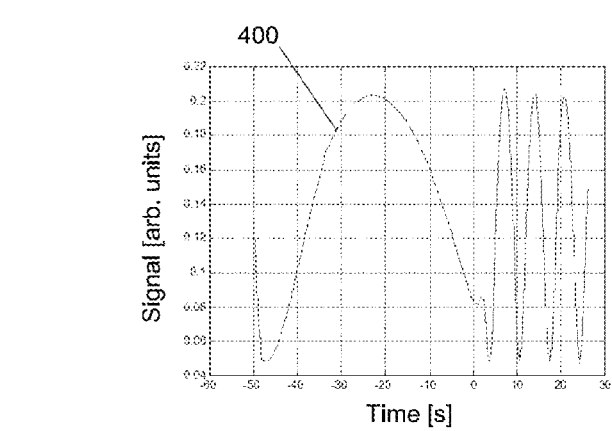

Evidently, the corrected signal 400 is very well behaved, and when the portion of the signal 400 corresponding to a single etch cycle, i.e. creation of a single step of a stepped structure is magnified, the graph in FIG. 4B is arrived at. This graph shows that during an etch cycle, the signal first undergoes a relatively slow change during the first plasma etch process, followed by a period of relatively fast change corresponding to the second plasma etch process. It should be noted here that no repositioning of the illuminated spot on the substrate 210 is done during this measurement process, and the signal 400 represents reflected light beam intensity from regions of the substrate covered by radiation-sensitive material and regions of the substrate where the first layer in which steps are formed, are exposed. This is because the illuminated spot size on substrate 210 is larger than the structures being measured during the etching process.

Figure 5:
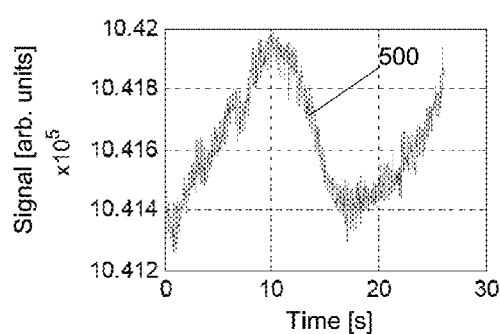
FIG. 5 represents an exemplary acquired light source reference signal measured in the in-situ optical monitor (ISOM).
Figure 6:
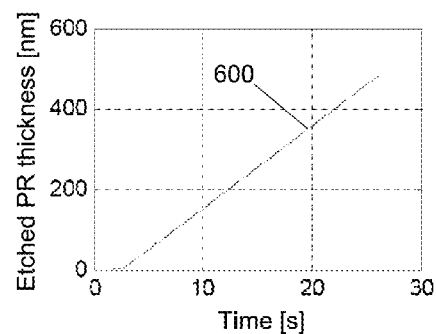
FIG. 6 represents an exemplary etched radiation-sensitive material thickness vs. time graph for an etch process controlled by the in-situ optical monitor (ISOM).

FIG. 5 shows an exemplary reference signal 500 measured by reference detector 140. It can clearly be seen that under typical operating conditions the output power, i.e. intensity of light source 110 and therefore incident light beam 150 vary over multiple time scales: a fast sub-second variation superimposed on top of a slow drifting variation over tens of seconds.

For an explanation of the dependence of a reflectometer signal on the thickness and properties of a film, or films on a substrate, please refer to U.S. Pat. No. 3,612,692, entitled "Dielectric film thickness monitoring and control system and method", U.S. Pat. No. 3,059,611, entitled "Monitoring apparatus", and U.S. Pat. No. 4,147,435, entitled "Interferometic process and apparatus for the measurement of the etch rate of opaque surfaces", all of which are incorporated by reference herein in their entirety. These incorporated references also describe the basic process of arriving at a measurement of a thickness of a layer on substrate 210 from the signal 400.

Now that the thicknesses of a layer or multiple layers in different regions of the substrate can be correlated to the signal 400, as described in the aforementioned incorporated references and via other methods known to those skilled in the art of semiconductor metrology, one can arrive at an exemplary graph of etched thickness vs. time during the etching process of a stepped structure on substrate 210, calculated from a portion of signal 400 of FIGS. 4A-B. Here it is clearly demonstrated that in-situ optical monitors (ISOMs) 100 and 101, of FIG. 1 or 2 are capable of accurately tracking the progress of an etch process, in-situ, and as such are therefore suitable for use for etch process control during the forming of stepped structures.

In order for a stepped structure to be accurately formed, good control has to be achieved of both the lateral recess of a step, i.e. the width of a step; and the height of a step. The relative simplicity of the in-situ optical monitors (ISOMs) 100 and 101, and the need for quick calculation of structure parameters from signal 400 dictate than only the thicknesses of layers can be measured in-situ. This means that the control of other properties, such as the lateral recess of a step needs to be achieved in some other way, since these properties cannot be directly measured by in-situ optical monitors (ISOMs) 100 and 101, unless advanced algorithms are used which slow down the acquisition rate and are therefore unsuitable for in-situ etch control.

The inventors have conceived a way to overcome these shortcomings, thereby allowing accurate control of parameters such as the lateral recess of a step. This control is accomplished by creating a correlation of lateral recess $I_{S3}$ as etched during the second etch process in first layer 304 vs. the etched thickness $t_{P1}$-$t_{P2}$ of radiation-sensitive material layer 308 during the first etch process (see FIGS. 3A-3C). Once the correlation of these parameters is known, precise control of lateral recess $I_{S3}$ of a step can be achieved by monitoring the etched thickness $t_{P1}$-$t_{P2}$ of radiation-sensitive material layer 308, which monitoring is well within the capabilities of in-situ optical monitors 100 or 101.

Figure 7:
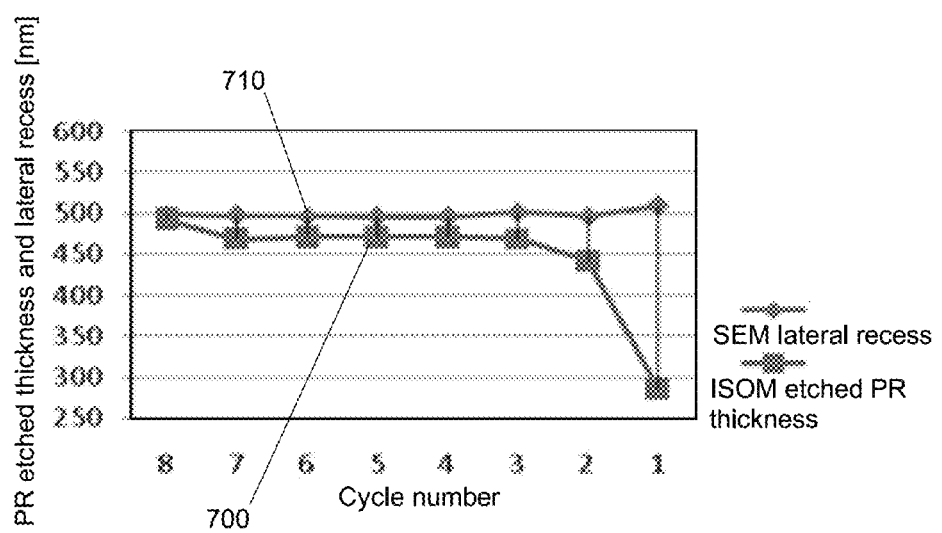
FIG. 7 represents a set of exemplary SEM lateral recess and radiation-sensitive material etched thickness data measured with the in-situ optical monitor (ISOM) vs. the step cycle number during the forming of a stepped structure.

FIG. 7 shows a method by which the aforementioned correlation can be determined. First, stepped structure formation etch cycles are being performed using a process of record (POR), with identical chemistries, materials, and conditions as will be used in production, but with fixed etch step times. Full substrates can be used in this process, or alternatively, coupons may be used in lieu of full substrates. However, when using coupons, care needs to be taken to ensure that the size of coupons does not affect the outcome of this process, due to e.g. microloading effects. During these fixed-time etch cycles, the etched thickness $t_{P1}$-$t_{P2}$ of the radiation-sensitive material layer 308 can be monitored by in-situ optical monitors 100 or 101, to create the trace 700 of the graph shown in FIG. 7. In general, the etched thickness $t_{P1}$-$t_{P2}$ will vary from one cycle to another due to microloading effects and also due to changes in the mask profile, e.g. changes of the sidewall angle of the radiation-sensitive material layer. Once the stepped structures are formed, the substrate 210 is removed from the etch tool and can be taken to a scanning electron microscope (SEM), or other suitable metrology tool such as an ODP (Optical Digital Profilometry) tool, where lateral recess $I_{S3}$ can be accurately measured, thereby providing data for trace 710 of the graph shown in FIG. 7. Now that the step lateral recesses $I_{S3}$ of first layer 304 are determined vs. etched thicknesses $t_{P1}$-$t_{P2}$ of radiation-sensitive material layer 308, for each etch cycle, the correlation of FIG. 7 is ready to use for process control.

In practice, etch process control for formation of stepped structures is accomplished as follows: during the first plasma etch process, when the radiation-sensitive material layer 308 is simultaneously etched in thickness and laterally trimmed, an in-situ optical monitor (ISOM) 100 or 101 is used to monitor the evolving etched thickness of radiation-sensitive material $t_{P1}$-$t_{P2}$. Prior to the first plasma etch process, a target etched thickness $(t_{P1}$-$t_{P2})_{target}$ of radiation-sensitive material is determined by proportionally scaling the data from trace 700 of the correlation of FIG. 7, wherein the scaling factor is determined by forming a ratio of the target lateral recess $(I_{S3})_{target}$ and the measured lateral recess $I_{S3}$ from trace 710 of the correlation of graph, for a particular etch cycle. In this fashion, the first etch process can be immediately stopped once the target etched thickness $(t_{P1}$-$t_{P2})_{target}$ has been reached, thereby assuring that the lateral recess $I_{S3}$ is also going to be close to or equal to the target lateral recess $(I_{S3})_{target}$.

To ensure that the height of a step $t_{S3}$ is also on target, i.e. $(t_{S3})_{target}$, in-situ optical monitor (ISOM) 100 or 101 can be used to directly monitor etched thickness of first layer 304 during the second plasma etch process, and to immediately stop the second plasma etch process when the target first layer thickness, and therefore target step height. $(t_{S3})_{target}$ is reached. In this latter case, no correlations are necessary because the height of a step can be easily calculated from the measured remaining total thickness of first layer 304 during the second plasma etch process, which total thickness is directly monitored by the in-situ optical monitor (ISOM) 100 or 101.

Besides the use of in-situ optical monitors (ISOMs) 100 or 101 for control of the second plasma etch process, alternative methods of control may be used, for example, Optical Emission Spectroscopy (OES). The latter method is well suited to the case where first layer 304 comprises sublayers of different, possibly alternating materials, as was already explained before. Optical Emission Spectroscopy (OES) is particularly well suited for control of the second plasma etch process where the sublayers of first layer 304, made of different material compositions, are aligned with the steps of the stepped structure to be produced. In this case, the endpoint signal produced by Optical Emission Spectroscopy (OES) will exactly indicate the time when the second plasma etch process has etched a step clearing all of its material, and exposing another material of the underlying step, i.e. sublayer of first layer 304.

Lastly, in non-critical applications, where plasma etch selectivity to the material of an underlying sublayer and/or step allows this, even an accurately timed second plasma etch process may be sufficient without the use of any of the previously-discussed control methods for controlling the duration of the second plasma etch process. In such a case, a slight amount of over-etch may be tolerable due to the selectivity to the material of the underlying sublayer and/or step.

Now will be provided examples of a few outcomes of forming stepped structures with and without the use of etch controls described above. In the first set of two examples, coupons were etched to form stepped structures with a simple timed etch used for the first plasma etch process, as in for example, the step of forming a correlation of lateral recess $I_{S3}$ as etched during the second etch process in first layer 304 vs. the etched thickness $t_{P1}$-$t_{P2}$ of radiation-sensitive material layer 308, described before. The target lateral recess of a step was 500 nm±10 nm, in a stepped structure comprising 8 steps.

The first two rows of Table 1 show the outcome of the forming of a stepped structure using a timed first plasma etch process. As can be seen in the table, in the first example, lateral recess of a step (i.e. $I_{S3}$) varied from 437 nm to 636 nm. In the second example, lateral recess varied from 414 nm to 628 nm. A standard deviation of lateral recess $I_{S3}$ of 33 nm has thus been achieved lacking advanced control of the duration of the first plasma etch process.

In the last six rows of Table 1, examples are given of outcomes of forming of stepped structures using the same specs, materials, plasma etch process conditions, etc., but using the aforementioned control of the first plasma etch process, using an in-situ optical monitor (ISOM) 100 of FIG. 1, along with the use of a correlation of lateral recess $I_{S3}$ as etched during the second plasma etch process in first layer 304 vs. the etched thickness $t_{P1}-t_{P2}$ of radiation-sensitive material layer 308, as described before. The values of $3\sigma$, i.e. three standard deviations are provided for all examples, and the benefit of having the in-situ optical monitor (ISOM) 100 control the etch processes for forming the stepped structure are clearly evident in the significant reduction of the realized range of lateral recess $I_{S3}$ and standard deviation thereof.

TABLE 1

| Coupon | Step 8 | Step 7 | Step 6 | Step 5 | Step 4 | Step 3 | Step 2 | Step 1 | 3XStdDev |
|---|---|---|---|---|---|---|---|---|---|
| Timed 1 | 636 | 453 | 437 | 457 | 429 | 441 | 453 | 441 | |
| Timed 2 | 628 | 457 | 441 | 421 | 425 | 421 | 414 | 406 | |
| Coupon #14 | 501 | 501 | 497 | 501 | 501 | 497 | 509 | 413 | 16.9 |
| Coupon #15 | 501 | 501 | 501 | 493 | 501 | 497 | 509 | 501 | 13.5 |
| Coupon #16 | 509 | 501 | 497 | 493 | 501 | 509 | 517 | 509 | 23.5 |
| Coupon #17 | 497 | 497 | 505 | 489 | 493 | 493 | 497 | 497 | 14.0 |
| Coupon #18 | 501 | 493 | 497 | 497 | 493 | 497 | 485 | 501 | 15.6 |

Persons skilled in the relevant art can appreciate that many modifications and variations are possible in light of the above teaching. Persons skilled in the art will recognize various equivalent combinations and substitutions for various components shown in the figures. It is therefore intended that the scope of the invention be limited not by this detailed description, but rather by the claims appended hereto.

What is claimed is:

1. A method for monitoring and controlling plasma etching, the method comprising:
    a) loading a substrate into a plasma processing chamber, the substrate comprising a structure which comprises a first layer formed thereupon and a radiation-sensitive material layer formed on top of the first layer;
    b) initiating a first plasma etch process in the plasma processing chamber, the first plasma etch process recipe being selected to selectively reduce the thickness of the radiation-sensitive material layer and laterally trim the radiation-sensitive material layer;
    c) illuminating the structure on the substrate with an incident light beam, the reflection of the incident light beam from the structure forming a reflected light beam;
    d) measuring a first intensity of the reflected light beam;
    e) determining the etched thickness of the radiation-sensitive material layer from the measured first intensity of the reflected light beam during the first plasma etch process;
    f) determining the amount of lateral recess of the first layer from a previously-established correlation of the amount of lateral recess of the first layer to the etched thickness of the radiation-sensitive material layer;
    g) comparing the amount of lateral recess of the first layer to a desired lateral recess of the first layer, and stopping the first plasma etch process if the amount of lateral recess of the first layer is equal to or greater than the desired lateral recess of the first layer, otherwise repeating steps c) through g), thereby forming a trimmed radiation-sensitive material pattern;
    h) initiating a second plasma etch process, the second plasma etch process recipe being selected to selectively etch the first layer so as to transfer the trimmed radiation-sensitive material pattern into the first layer;
    i) illuminating the structure on the substrate with the incident light beam, the reflection of the incident light beam from the structure forming the reflected light beam;
    j) measuring a second intensity of the reflected light beam;
    k) determining an etched thickness of the first layer in a region not covered by the radiation-sensitive material layer, from the measured second intensity of the reflected light beam; and
    l) comparing the etched thickness of the first layer to a desired etched thickness of the first layer, and stopping the second plasma etch process if the etched thickness of the first layer is greater than or equal to the desired etched thickness of the first layer, otherwise repeating steps j) through l), thereby forming a step in the first layer.

2. The method of claim 1, further comprising:
    m) repeating steps b) through l) until a stepped structure is formed in the first layer on the substrate, wherein successive steps formed in the first layer have a progressively smaller lateral dimension as a distance of a step from the substrate increases.

3. The method of claim 2, further comprising:
removing any residual radiation-sensitive material from the stepped structure.

4. The method of claim 1, wherein establishing the correlation of the amount of lateral recess of the first layer to the etched thickness of the radiation-sensitive material layer comprises measuring the amount of lateral recess of the first layer with a scanning electron microscope (SEM).

5. The method of claim 4, wherein establishing the correlation of the amount of lateral recess of the first layer to the etched thickness of the radiation-sensitive material layer is performed prior to step a), using test substrates.

6. The method of claim 1, wherein the first layer comprises a plurality of sublayers.

7. The method of claim 6, wherein the plurality of sublayers comprise alternating materials across the thickness of the first layer.

8. The method of claim 1, wherein the steps of measuring the first and second intensities of the reflected light beam are performed using a reflectometer, comprising:
- a light source for providing an incident light beam for substrate illumination, the incident light beam being reflected from the substrate to form a reflected light beam;
- a photodetector for measuring an intensity of the reflected light beam,
- an optical window mounted on a wall of the plasma processing chamber opposite the substrate, the optical window being configured to transmit the incident light beam and the reflected light beam, the optical window comprising an upper window, a lower window, and a window mesh.

9. A method for monitoring and controlling plasma etching, the method comprising:
- a) loading a substrate into a plasma processing chamber, the substrate comprising a structure which comprises a first layer formed thereupon and a radiation-sensitive material layer formed on top of the first layer;
- b) initiating a first plasma etch process in the plasma processing chamber, the first plasma etch process recipe being selected to selectively reduce the thickness of the radiation-sensitive material layer and laterally trim the radiation-sensitive material layer;
- c) illuminating the structure on the substrate with an incident light beam, the reflection of the incident light beam from the structure forming a reflected light beam;
- d) measuring a first intensity of the reflected light beam;
- e) determining the etched thickness of the radiation-sensitive material layer from the measured first intensity of the reflected light beam during the first plasma etch process;
- f) determining the amount of lateral recess of the first layer from a previously-established correlation of the amount of lateral recess of the first layer to the etched thickness of the radiation-sensitive material layer;
- g) comparing the amount of lateral recess of the first layer to a desired lateral recess of the first layer, and stopping the first plasma etch process if the amount of lateral recess of the first layer is equal to or greater than the desired lateral recess of the first layer, otherwise repeating steps c) through g), thereby forming a trimmed radiation-sensitive material pattern;
- h) initiating a second plasma etch process, the second plasma etch process recipe being selected to selectively etch the first layer so as to transfer the trimmed radiation-sensitive material pattern into the first layer;
- i) stopping the second plasma etch process after a predetermined time or after an etch endpoint signal is received from an optical emission spectroscopy (OES) device attached to the plasma processing chamber, thereby forming a step in the first layer.

10. The method of claim 9, further comprising:
- j) repeating steps b) through i) until a stepped structure is formed in the first layer on the substrate, wherein successive steps formed in the first layer have a progressively smaller lateral dimension as a distance of a step from the substrate increases.

* * * * *